United States Patent [19]

Chang et al.

[11] Patent Number: 4,807,008
[45] Date of Patent: Feb. 21, 1989

[54] STATIC MEMORY CELL USING A HETEROSTRUCTURE COMPLEMENTARY TRANSISTOR SWITCH

[75] Inventors: Mau-Chung F. Chang, Thousand Oaks; Peter M. Asbeck, Newbury Park; Keh-Chung Wang; David L. Miller, both of Thousand Oaks, all of Calif.

[73] Assignee: Rockwell International Corporation, El Segundo, Calif.

[21] Appl. No.: 95,974

[22] Filed: Sep. 14, 1987

[51] Int. Cl.⁴ .......................................... H01L 29/72
[52] U.S. Cl. ........................................ 357/34; 357/16; 357/44; 357/38
[58] Field of Search ................... 357/16, 4, 38, 44, 46, 357/34, 15; 365/180

[56] References Cited

U.S. PATENT DOCUMENTS 4,388,633  6/1983  Vasudev .............................. 357/38
4,649,411  3/1987  Birrittella .......................... 357/16

FOREIGN PATENT DOCUMENTS 60-164353  8/1985  Japan ................................. 357/16

OTHER PUBLICATIONS

IBM Technical Disclosure Bulletin, vol. 15, #2, p. 470 by Blum, Jul. 1972.
IBM Journal Research Development, vol. 25, #3, pp. 126-134 by Dorler et al., May 1981.
Journal of Applied Physics Letters vol. 50, #6, pp. 338-340 by Taylor.

Primary Examiner—Andrew J. James
Assistant Examiner—Mark Prenty
Attorney, Agent, or Firm—H. Fredrick Hamann; Craig O. Malin

[57] ABSTRACT

A heterostructure complementary transistor switch (HCTS) is fabricated using epitaxial layers on a substrate to form the desired P-N-P-N (or N-P-N-P) complementary structure in III-V compound semiconductor materials. Two HCTS are formed on a single substrate to form a memory cell. A collector and a base on one of the HCTs are connected to a base and a collector, respectively, on the other HCTS to form the memory cell.

7 Claims, 2 Drawing Sheets

STATIC MEMORY CELL USING A HETEROSTRUCTURE COMPLEMENTARY TRANSISTOR SWITCH

BACKGROUND OF THE INVENTION

This invention relates to the field of solid state electronics and particularly to a heterostructure complementary transistor switch which is useful in a memory cell.

Complementary transistor switches (CTSs) have been used for memory cells in silicon bipolar random access memory (RAM) circuits. Such a prior art RAM circuit is shown in FIG. 1 (IBM Journal Research Development, Vol. 25, No. 3, May 19871, pp. 126-134). These complementary transistor switches have good stability and use little standby power.

Although silicon has proven to be a very useful and practical semiconductor, the performance of integrated circuits such as complementary transistor switch memory cells is ultimately limited by the properties of the semiconductor used. For this reason, new integrated circuit devices are being developed to take advantage of the properties of Group III-V semiconducting compounds such as GaAs. For example, GaAs heterojunction bipolar transistors (HBTs) with lower internal resistance than Si HBTs can be obtained using high base doping concentration in the GaAs.

Additionally, integrated circuits in prior art silicon devices use a horizontal layout in which individual devices are formed on the surface of the chip, requiring spacing between the electrodes. Consequently, the number of CTSs that can be packed onto a given area is lower than could be obtained using a vertical structure with an aspect ratio near unity. In addition to conserving chip area, a higher packing density also provides higher operating speed.

SUMMARY OF THE INVENTION

It is an object of the invention to provide a heterostructure complementary transistor switch (HCT) having high operating speed.

It is an object of the invention to provide an improved memory cell which uses a heterostructure complementary transistor switch.

It is an object of the invention to provide a heterostructure complementary transistor switch using Group III-V semiconducting compounds.

It is an object of the invention to provide a heterostructure complementary transistor switch having a vertical structure with an aspect ratio near unity.

According to the invention, a vertical heterostructure complementary transistor switch (HCTS) is fabricated using four epitaxial layers of different Group III-V semiconducting compounds on a semi-insulating substrate. The layers alternate between n-type and p-type conductivity to provide three p-n heterojunctions of two complementary heterojunction bipolar transistors (HBTs) with the switch.

In a preferred embodiment, the semi-insulating substrate is GaAs. An epitaxial, n-type conductivity layer is grown on the substrate. This first layer comprises three sublayers, an n$^+$-type GaAs sublayer, an n$^+$-type InAs sublayer, and an n$^-$-type GaAs sublayer. The InAs sublayer is provided so that an ohmic contact can be made to the first n-type layer which forms the emitter of a first HBT.

The second layer is a p$^+$-type layer of InGaAs. An ohmic contact is made to this layer which forms the base of the first HBT and also the collector of the second HBT.

The third layer is an n-type layer which comprises an n$^-$-type GaAs sublayer and an n$^+$-type InAs sublayer. An ohmic contact is made on the InAs sublayer. This third layer completes the first HBT (an n-p-n HBT) by forming its collector. It also serves as the base for the second HBT.

The fourth layer is a p-type layer consisting of a p$^-$-type AlGaAs sublayer, a p$^+$-type sublayer of GaAs, and a p$^-$-type sublayer of InSb with an ohmic contact. This fourth layer is the emitter of the second HBT (a p-n-p HBT).

A Schottky metal deposit can be formed on the n$^-$-type GaAs sublayer of the third layer to provide a Schottky diode to the base of the second HBT.

A Schottky diode can also be provided between the bases of the first and second HBTs. This is accomplished by providing a second Schottky metal deposit on the n$^-$-type GaAs and connecting it to an ohmic contact on the p$^+$-type InGaAs second layer.

To provide a memory cell, two of the heterostructure complementary transistor switches (HCTSs) described above are formed on the same semi-insulating substrate. A collector and a base on one of the HCTSs are connected to a base and a collector, respectively, on the other HCTs.

Because of its vertical structure, the HCT of the invention has an aspect ratio near unity (x dimension divided by y dimension). This ensures compatability with support circuits to keep the array size as square as possible. Additionally, a high packing density can be obtained because the electrodes are separated in the vertical direction and do not require horizontal spaces to provide separation. Consequently, many HCTs can be packed on a chip to achieve a high scale of integration with small real estate. The circuit speed is improved by the favorable aspect ratio, by the high packing density, and by the faster carrier velocity obtained using Group III-V semiconductors.

These and other objects and features of the invention will be apparent from the following detailed description taken with reference to the accompanying drawings.

DESCRIPTION OF THE PREFERRED EMBODIMENT

Figure 1:
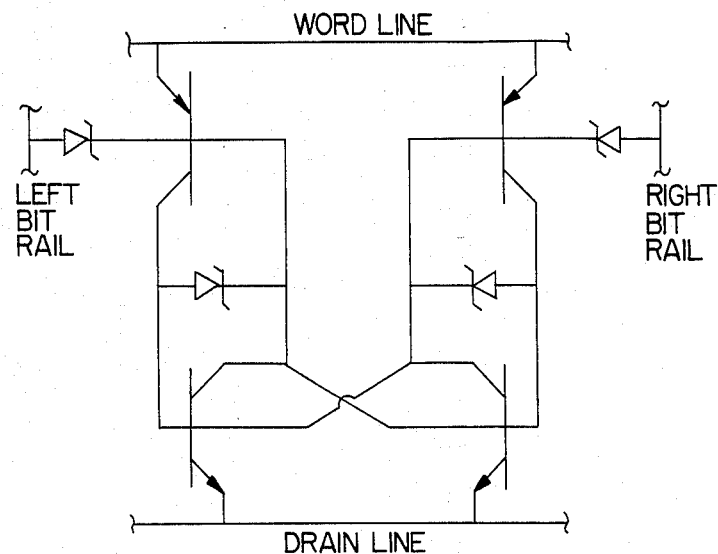
FIG. 1 is a prior art silicon bipolar random access memory circuit.
Figure 2:
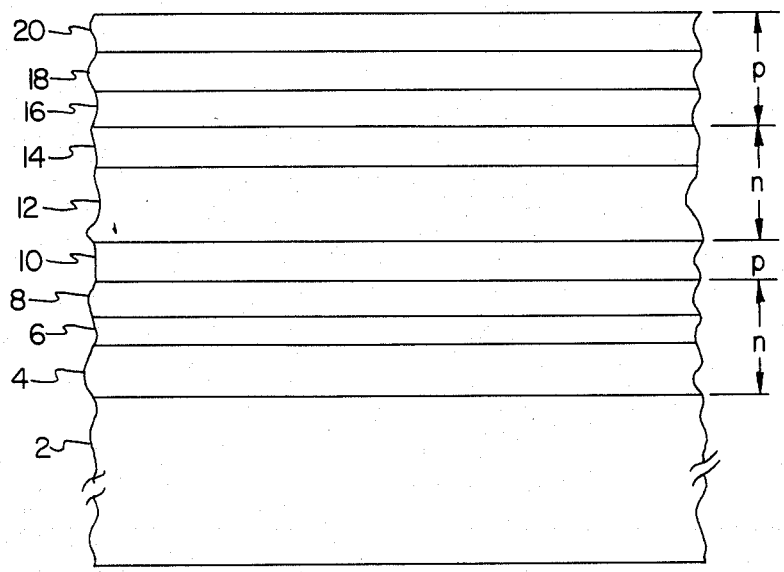
FIG. 2 is a cross section illustrating a semiconducting wafer suitable for fabricating a heterostructure complementary transistor switch (HCTS) and memory cells according to the invention.

FIG. 2 is a cross section illustrating a semiconducting wafer suitable for fabricating heterostructure complementary transistor switches (HCTSs) and memory cells according to the invention. Such a wafer can be formed using known technologies such as molecular beam epitaxy (MBE) or metal organic chemical vapor deposition (MOCVD). Epitaxial layers of different group III–V compounds such as GaAs, InGaAs, AlGaAs are grown to form the desired n-p-n-p structure. Doping concentrations and layer thickness are tailored to fulfill the requirements for complementary transistor heterojunction devices.

Semi-insulating GaAs is used for substrate 2. The first layer is an n-type conductivity layer comprising three sublayers 4, 6, 8 which are grown epitaxially on the substrate. These sublayers consist of n+-type GaAs, N+-type InAs, and n−-type GaAs. Sublayers such as InAs 6 are used to facilitate the deposition of non-alloyed n-type ohmic contacts, to provide etch stops during subsequent processing, and to provide sufficient lattice matching of adjacent heterolayers.

The second layer is p+-type InGaAs 10. It forms an n-p heterojunction with the underlying first layer.

The third layer comprises a sublayer 12 of n−-type GaAs and a sublayer 14 of n+-type InGaAs. It forms a p-n heterojunction with the underlying second layer.

The fourth layer comprises a sublayer 16 of p−-type AlGaAs, a sublayer 18 of p+-type GaAs, and a sublayer 20 of p+-type InSb for a non-alloyed p-type ohmic contacts.

Figure 3:
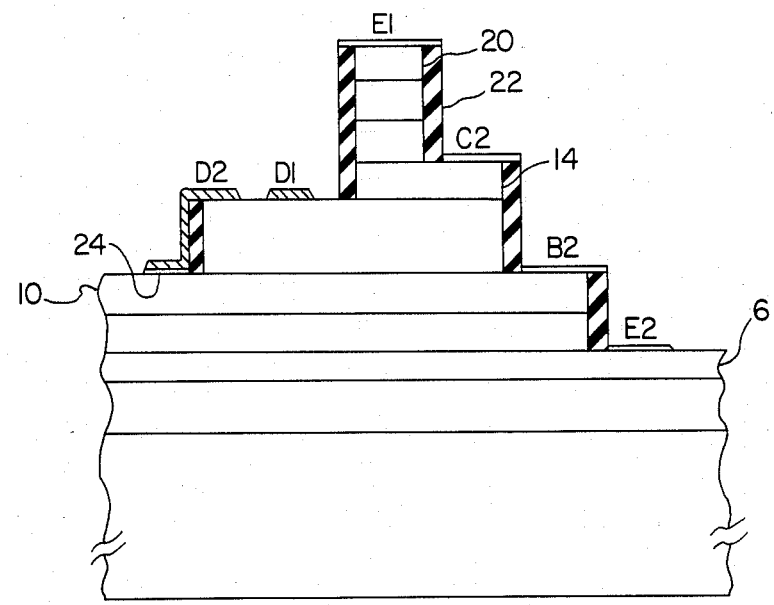
FIG. 3 is a cross section illustrating the HCTS according to the invention.

FIG. 3 illustrates the arrangement of the heterostructure complementary transistor switch (HCTS) after the wafer shown in FIG. 2 has been processed to provide the HCTS of the invention. Such processing utilizes a series of masking, selective etching, and metallization techniques available to the artisan. The top layers have been etched down to the n+-type InAs layer 6 in order to provide ohmic contact E2 for the emitter of a first heterojunction bipolar transistor (HBT).

Similarly, non-alloyed ohmic contacts have been formed on p+-type InGaAs layer 10, n+-type InAs layer 14, and p+-type InSb layer 20 to form contacts B2, C2, and E1 with the same metal. B2 serves as a contact for both the base of the first HBT and the collector of the second HBT. C2 serves as a contact for both the collector of the first HBT and the base of the second HBT. And E1 is the contact for the emitter of the second HBT.

Dielectric deposits 22 on the sidewalls of the layers provide insulation between the sidewalls and the ohmic contacts.

FIG. 3 also shows two Schottky diodes, D1 and D2 which are provided on the HCTS. Schottky deposit D1 provides a Schottky diode contact to the base of the second HBT. Schottky deposit D2 which is joined to metal contact 24 provides a Schottky diode between the bases of the first and second HBTs.

Figure 4:
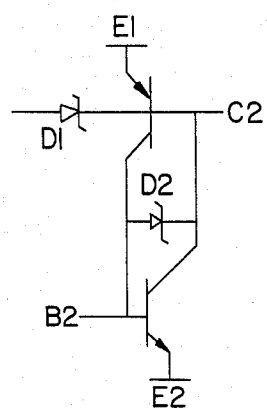
FIG. 4 is the equivalent circuit of the HCTS shown in FIG. 3.

The equivalent circuit provided by the structure illustrated in FIG. 3 is shown in FIG. 4.

Figure 5:
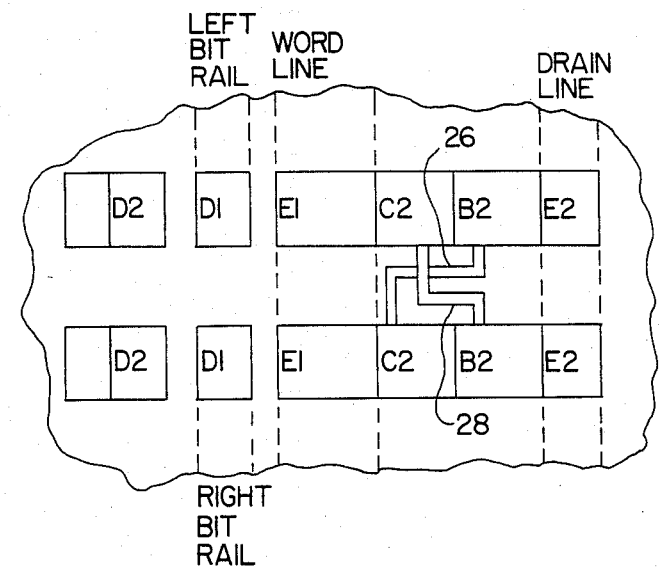
FIG. 5 is a plan view of two HCTSs coupled together to provide a memory cell.

Two HCTSs can be fabricated together on a single wafer and coupled together as shown in FIG. 5 to provide a memory cell. In this arrangement, both HCTSs share the same substrate 2 and n-type conductivity layers 4, 6. Electrical isolation between the two HCTSs is provided, for example, by ion implantation. A metal deposit provides a conductor 26 between collector C2 on one of the HCTSs to base B2 on the other HCTS. Another conductor 28 connects collector C2 on the other HCTS to base B2 on the first HCTS. Conductors 26 and 28 are insulated from each other using a dielectric deposit on conductor 26, or other means for avoiding contact. As shown in FIG. 5, horizontal spaces are not required between contacts E1, C2, B2, and E2 because separation and insulation 22 is provided in the vertical direction.

Structures such as described above offer the potential for: high speed memory cells and peripheral circuits with heterojunction bipolar transistors; the use of self-aligned processes leading to high yield of circuits; low internal linkage resistance obtained by high base doping concentrations; and integration with optical data transmission.

Numerous variations can be made without departing from the invention. For example, p-n-p-n complementary transistors (rather than the exemplary n-p-n-p) can be fabricated. Other semiconductors can be used to form the heterojunctions of the HCTS and to facilitate fabrication of the ohmic contacts and provide lattice matching between the heterolayers. Accordingly, it should be understood that the form of the invention described above is illustrative and is not intended to limit the scope of the invention.

What is claimed is:

1. A heterostructure complementary transistor switch (HCTS) comprising:
   a semi-insulating substrate;
   a first semiconducting layer of a one-type conductivity on the substrate;
   an emitter contact on the first semiconducting layer of one-type conductivity forming an emitter of a first heterojunction bipolar transistor (HBT);
   a second semiconducting layer of opposite-type conductivity on the first semiconducting layer forming a heterojunction between the first and second layers;
   a contact on the second semiconducting layer forming the base of the first HBT and a collector of a second HBT;
   a third semiconducting layer of the one-type conductivity on the second semiconducting layer forming a heterojunction between the second and third layers;
   a contact on the third semiconducting layer forming a collector of the first HBT and a base of the second HBT;
   a fourth semiconducting layer of the opposite-type conductivity on the third semiconducting layer forming a heterojunction between the third and fourth layers; and
   an emitter contact on the fourth semiconducting layer forming an emitter of the second HBT.

2. The HCTS as claimed in claim 1 wherein the one-type conductivity is n-type conductivity and the opposite-type conductivity is p-type conductivity.

3. The HCTS as claimed in claim 1 wherein the one-type conductivity is p-type conductivity and the opposite type conductivity is n-type conductivity.

4. The HCTS as claimed in claim 1 including:
   a first Schottky metal deposit on the third layer forming a Schottky diode to the base of the second HBT;
   a second Schottky metal deposit on the third layer;
   an ohmic contact on the second layer; and
   a conductor joining the ohmic contact to the second Schottky metal deposit, thereby providing a Schottky diode between the bases of the first and second HBTs.

5. A memory cell using a heterostructure complementary transistor switch (HCTS), comprising:
   a first HCTS as claimed in claim 1;

a second HCTS as claimed in claim 1 having the same substrate and first semiconducting layer as the first HCTS, but being electrically isolated from the first HCTS;

a first conductor connecting the collector of the first HBT on the first HCTS to the base of the first HBT on the second HCTS; and a second conductor connecting the base of the first HBT on the first HCTS to the collector of the first HBT on the second HCTS.

6. The memory cell as claimed in claim 5 wherein the first and second HCTS each include:

a first Schottky metal deposit on the third layer forming a Schottky diode to the base of the second HBT;

a second Schottky metal deposit on the third layer;

an ohmic contact on the second layer; and a conductor joining the ohmic contact to the second Schottky metal deposit, thereby providing a Schottky diode between the bases of the first and second HBTs.

7. A heterostructure complementary transistor switch (HCTS) comprising:

a semi-insulating substrate;

a first semi conducting layer on the substrate comprising an $n^+$-type GaAs sublayer, an $n^+$-type InAs sublayer, and an $n^-$-type GaAs layer;

an emitter contact on the $n^+$-type InAs sublayer of the first semiconducting layer forming an emitter of a first heterojunction bipolar transistor (HBT);

a second semiconducting layer of $p^+$-type InGaAs on the first semiconducting layer forming a heterojunction between the first and second layers;

a contact on the second semiconducting layer forming the base of the first HBT and collector of a second HBT;

a third semiconducting layer on the second semiconducting layer forming a heterojunction between the second and third layers, the third semiconducting layer comprising an $n^-$-type GaAs sublayer and $n^+$-type InGaAs sublayer;

a contact on the $n^+$-type InGaAs sublayer of the third semiconducting layer forming a collector of the first HBT and a base of the second HBT;

a fourth semiconducting layer on the third semiconducting layer forming a heterojunction between the third and fourth layers, the fourth semiconducting layer comprising a $p^-$-type AlGaAs sublayer, a $p^+$-type GaAs sublayer, and a $p^+$-type InSb sublayer; and an emitter contact on the $p^+$-type InSb of the fourth semiconducting layer forming an emitter of the second HBT.

* * * * *